(12) United States Patent
Lung et al.

(10) Patent No.: US 6,965,522 B2
(45) Date of Patent: Nov. 15, 2005

(54) TUNNELING DIODE MAGNETIC JUNCTION MEMORY

(75) Inventors: Hsiang-Lan Lung, Hsinchu (TW); Ruichen Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/802,333

(22) Filed: Mar. 17, 2004

(65) Prior Publication Data

US 2005/0207218 A1 Sep. 22, 2005

(51) Int. Cl.⁷ .............................................. G11C 11/14
(52) U.S. Cl. ...................... 365/171; 365/175; 365/105
(58) Field of Search .............................. 365/171, 175, 365/105, 189.01

(56) References Cited

U.S. PATENT DOCUMENTS

| | | | |
|---|---|---|---|
| 5,640,343 A * | 6/1997 | Gallagher et al. | .......... 365/171 |
| 5,793,697 A | 8/1998 | Scheuerlein | |
| 5,801,984 A | 9/1998 | Parkin | |
| 5,838,608 A | 11/1998 | Zhu et al. | |
| 5,930,164 A | 7/1999 | Zhu | |
| 6,347,049 B1 | 2/2002 | Childress et al. | |
| 6,842,368 B2 * | 1/2005 | Hayakawa | .................. 365/173 |

* cited by examiner

*Primary Examiner*—Vu A. Le
(74) *Attorney, Agent, or Firm*—Stout, Uxa, Buyan & Mullins, LLP

(57) ABSTRACT

A tunneling diode magnetic junction memory that eliminates the need for a separate semiconductor diode is disclosed. The diode is formed by an insulating layer that is located between a free magnetic layer and a pinned magnetic layer. The present invention further discloses a method of reading the contents of a memory cell in a bi-directional manner in order to extend a storage life of the memory cell.

22 Claims, 10 Drawing Sheets

TUNNELING DIODE MAGNETIC JUNCTION MEMORY

BACKGROUND OF THE INVENTION

1. Field of the Invention

The present invention relates generally to memory devices and, more particularly, to a non-volatile magnetic memory devices.

2. Description of Related Art

Integrated circuits, typically in the form of microprocessors, microcontrollers, or other logic circuits, are used to control the functions of many modern electronic devices. For example, integrated circuits are used to control the functions of computers, telephones, and many other consumer electronics. It is generally necessary for the integrated circuits to retrieve (read) and store (write) data as they perform their functions. The data may be in the form of instructions for the integrated circuits (e.g., a program), data necessary for the execution of a program, or data generated during the execution of the program. It is preferable to store the data in memory devices which are easily accessible by the integrated circuits.

Many different types of memory devices are known for the storage of data. In selecting a memory device, the particular requirements for the data with which the memory device will be used are important. For example, several parameters such as the quantity of data, the required access time and the required storage time can play an influential role in memory device selection.

Magnetic random access memory (MRAM) is a type of memory that retains stored information after power has been removed from the memory device. This type of memory is called non-volatile memory. Magnetic random access memory has lower power consumption than short-term memory such as dynamic random access memory (DRAM), static random access memory (SRAM) or Flash memory. Magnetic random access memory can perform read and write operations much faster (by orders of magnitude) than conventional long-term storage devices such as hard drives. In addition, magnetic memory is more compact and consumes less power than hard drives.

A typical magnetic memory device includes an array of memory cells with word lines extending along rows of the memory cells, and bit lines extending along columns of the memory cells. Memory cells are located at intersections of the word lines and bit lines. A typical magnetic memory cell includes a magnetic pinned layer, a magnetic free layer, an insulating barrier sandwiched between the pinned and free layers and a semiconductor diode located between the memory cell and a substrate. The pinned layer has a magnetization orientation that is fixed so as not to rotate in the presence of an applied magnetic field in a range of interest. The free layer has a magnetization that can be oriented in either of two directions: the same direction as the pinned layer magnetization or the opposite direction of the pinned layer magnetization. These two magnetization directions can correspond to logic values of 0 and 1 in a memory system. The semiconductor diode prevents leakage currents from flowing between adjacent memory cells in the array. Such leakage currents can lead to inaccurate or erroneous readings of the contents of the memory cell.

Methods of making and designs for magnetic memories are disclosed in U.S. Pat. No. 5,838,608 to Zhu et al; U.S. Pat. No. 5,793,697 to Scheuerlein; U.S. Pat. No. 5,930,164 to Zhu; U.S. Pat. No. 5,801,984 to Parkin and U.S. Pat. No. 6,347,049 to Childress et al, all of which are hereby incorporated by reference in their entireties. As set fourth in the prior art, a typical magnetic tunnel junction memory cell requires a semiconductor diode in series with the cell in order to prevent leakage currents from flowing to adjacent cells. Unfortunately, the semiconductor diode can be difficult to fabricate on the memory cell, can add additional expense and can lead to lower yields. Another problem exists with the storage times of magnetic memory cells. When the contents of a magnetic memory cell are read by the application of an electric current, some of magnetic domains can be slightly mis-oriented from their original orientation. After a number of read cycles, the magnetic orientation can be degraded from what was originally written to the cell, thus causing a shorter retention or storage time for data contained within the memory cell.

A need thus exists in the prior art for a magnetic memory that does not require a separate diode to prevent leakage currents for the device. A further need exists for a magnetic memory cell that has an improved storage life.

SUMMARY OF THE INVENTION

The present invention discloses a magnetic memory structure that eliminates the need for a separate semiconductor diode. The present invention further discloses an innovative method of reading the contents of a memory cell in order to extend the storage life of the memory cell.

In accordance with one aspect of the present invention, a magnetic memory cell comprises a first ferromagnetic layer and a second ferromagnetic layer. An insulating layer is disposed between the first and second ferromagnetic layers. The insulating layer forms a diode that prevents leakage currents. Several of the memory cells are formed into an array of memory cells. The array of memory cells is interconnected by column conductor lines and row conductor lines that are oriented perpendicularly to each other.

In accordance with another aspect of the present invention, a method of reading a memory structure comprises generating a first current during a first read cycle. The first current flows from a column line through the memory structure to a row line. A second current is generated during a second read cycle. The second current flows from the row line through the memory structure to the column line. The direction of current flow through the memory structure is reversed for each subsequent read cycle. The memory structure is therefore read with a bi-directional current.

In accordance with another aspect of the present invention, a memory cell comprises a fixed magnetic layer that has a magnetic moment that is fixed in a pre-determined direction. A free magnetic layer has a magnetic moment that is free to rotate under the influence of an applied magnetic field. An insulating layer is disposed between the fixed and free magnetic layers. A tunneling diode is formed by the insulating layer in combination with the fixed and free magnetic layers. The tunneling diode allows a current between the free magnetic layer when selected and the fixed magnetic layer when selected and prevents leakage current between the fixed magnetic and free magnetic layers when not selected. Several of the memory cells are formed into a memory cell array. The memory cells are interconnected by column conductor lines and row conductor lines. A memory cell is located at the junction of each column line and conductor line. The column lines are connected to the free magnetic layers and the row lines are connected to the fixed magnetic layers.

In accordance with another aspect of the present invention, a method of reading an array of memory cells comprises providing several column lines and row lines that are connected across the array of memory cells. A column line and a row line are selected during a first read cycle such that a first current flows from the column line through a first memory cell to the row line. The current flows from the row line to the column line during a second read cycle. The current flow is thus reversed during the second read cycle of the first memory cell such that the storage life of the memory cell is extended. The direction of current flow through the first memory cell is reversed for each subsequent read cycle. The number of read cycles is recorded for each memory cell in the array.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
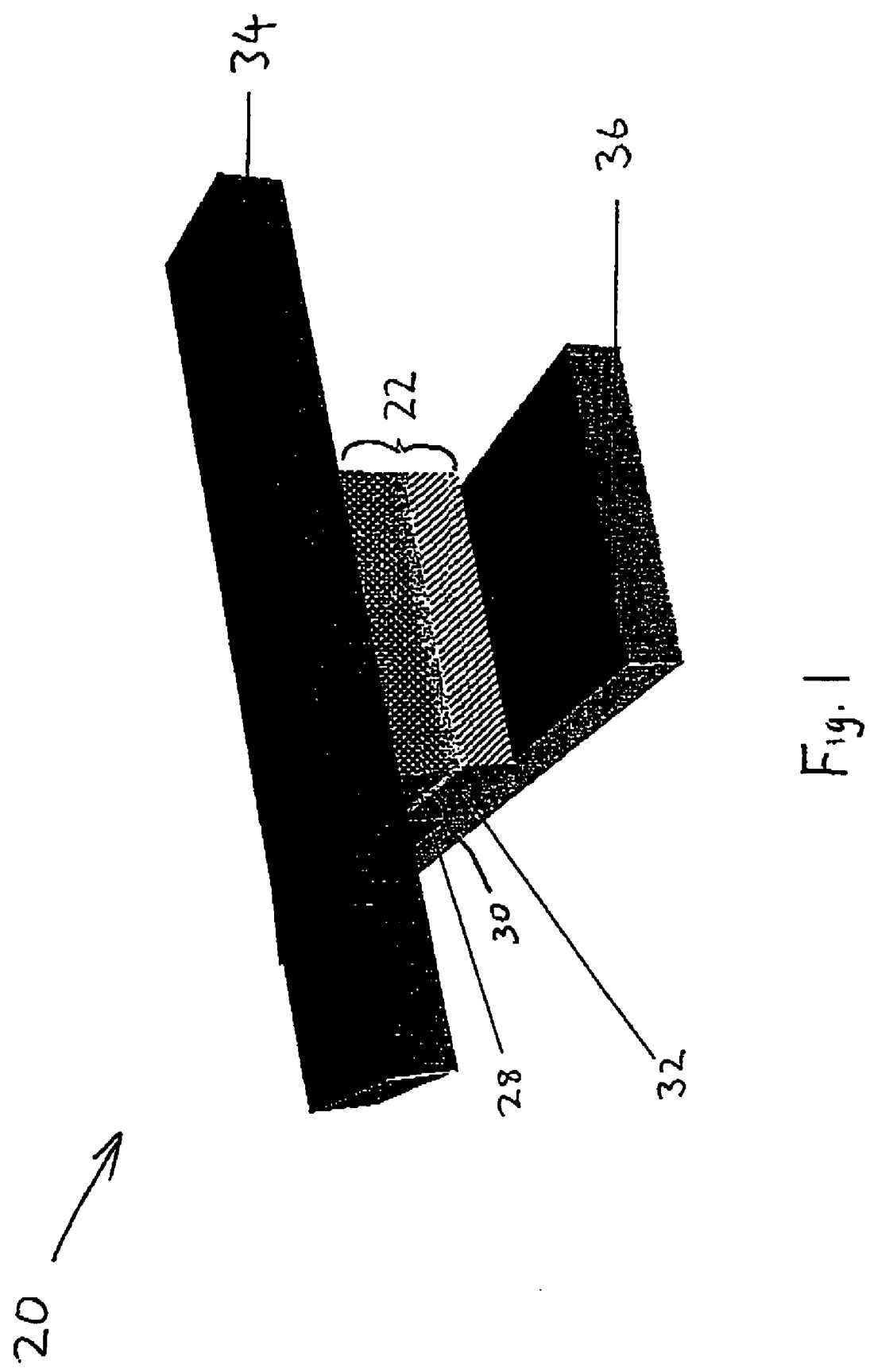
FIG. 1 is a schematic diagram of a magnetic memory cell in accordance with the present invention.

Reference will now be made in detail to the presently preferred embodiments of the invention, examples of which are illustrated in the accompanying drawings. Wherever possible the same or similar reference numbers are used in the drawings and the description to refer to the same or like parts. It should be noted that the drawings are in simplified form and are not to precise scale. In reference to the disclosure herein for purposes of convenience and clarity only, directional terms, such as top, bottom, left, right, up, down, over, above, below, beneath, rear, front, vertical, horizontal, length, width, and height are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the structures and methods described herein do not cover a complete assembly or process flow for the manufacture of magnetic random access memories. The present invention may be practiced in conjunction with various fabrication techniques that are conventionally used in the art, and only so much of the commonly practiced process steps are included herein as are necessary to provide an understanding of the present invention. For illustrative purposes, the following description pertains to magnetic tunnel junction memory.

Figure 2:
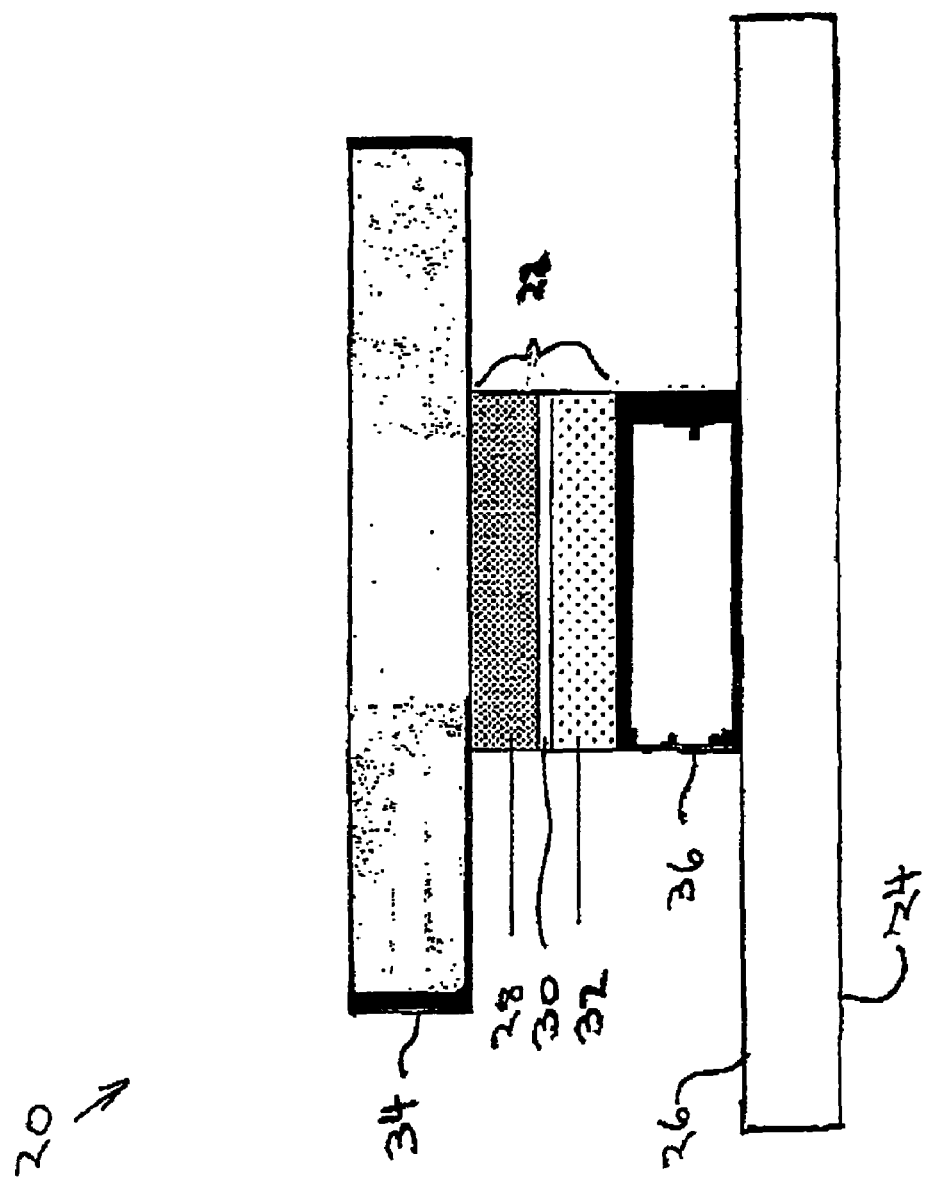
FIG. 2 is a schematic diagram of a magnetic memory cell showing a cross-sectional view in accordance with the present invention.

FIGS. 1 and 2 show a schematic diagram depicting an individual magnetic memory device or unit 20. Magnetic memory device 20 has a substrate 24. Substrate 24 can be formed from a variety of materials. Substrate 24 is typically formed from a semi-conductor, ceramic or glass material. A row conductor line 36 rests on a top surface 26 of substrate 24. A magnetic memory cell 22 is disposed on row conductor line 36. Column conductor line 34 can be located on top of magnetic memory cell 22. Column and row conductor lines 34 and 36 can be formed from a metal such as Aluminum, Copper or Tungsten.

Magnetic memory cell 22 has three layers that include a free magnetic layer 28, a fixed or pinned magnetic layer 32 and an insulating layer 30 that is located between the free and pinned magnetic layers 28 and 32. The insulating layer 30 is designed such that it forms an embedded tunneling diode that attenuates and preferably eliminates an occurrence of leakage currents between adjacent memory cells. The tunneling diode allows a current flow from the selected free magnetic layer 28 to the selected pinned magnetic layer 32 but blocks current flow from the unselected pinned magnetic layer 32 to the unselected free magnetic layer 28.

Free and pinned magnetic layers 28 and 32 can each be a single layer or can be made up of several layers. Free magnetic layer 28 can be formed from cobalt-iron that is on the order of 2 to 8 nano-meters in thickness, and pinned magnetic layer 32 can be formed from nickel-iron that is on the order of 5 to 10 nano-meters in thickness. Insulating layer 30 can be a single layer or can be made up of several layers. Insulating layer 30 can be formed from various materials such as aluminum oxide (e.g., alumina), hafnium oxide and zirconium oxide, and can be formed to have a thickness of less than about 2 nano-meters. The magnetic memory cell 22 behaves like a variable resistor, in that it can have varied conductivities depending upon the orientation of the magnetic fields in the free and pinned magnetic layers 28 and 32. The memory cell therefore can have 2 states and can store information as a 0 or 1. Information can be written to the memory cell and later read from the memory cell by altering a state of the memory cell and subsequently detecting that altered state.

Magnetic memory devices 20 can be fabricated using conventional semi-conductor processing methods and techniques. For example, row conductor lines 36 can be deposited onto a silicon substrate 24 by sputtering on a metal layer. Pinned magnetic layer 32, insulating layer 30, and free magnetic layer 28 can be sequentially deposited using methods including sputtering and chemical vapor deposition (CVD) techniques to deposit the nickel-iron, insulator and cobalt-iron layers. Following deposition and etching in connection with the aforementioned layers, column conductor lines 34 can be added by sputtering on another metal layer. The multi-layers are thus deposited and patterned using conventional photolithography techniques and etching methods to form individual magnetic memory devices 20. While the manufacturing of one of the memory devices 20 has been described, it is possible to make dense arrays of memory devices 20 that include thousands or millions of individual memory units.

Figure 3:
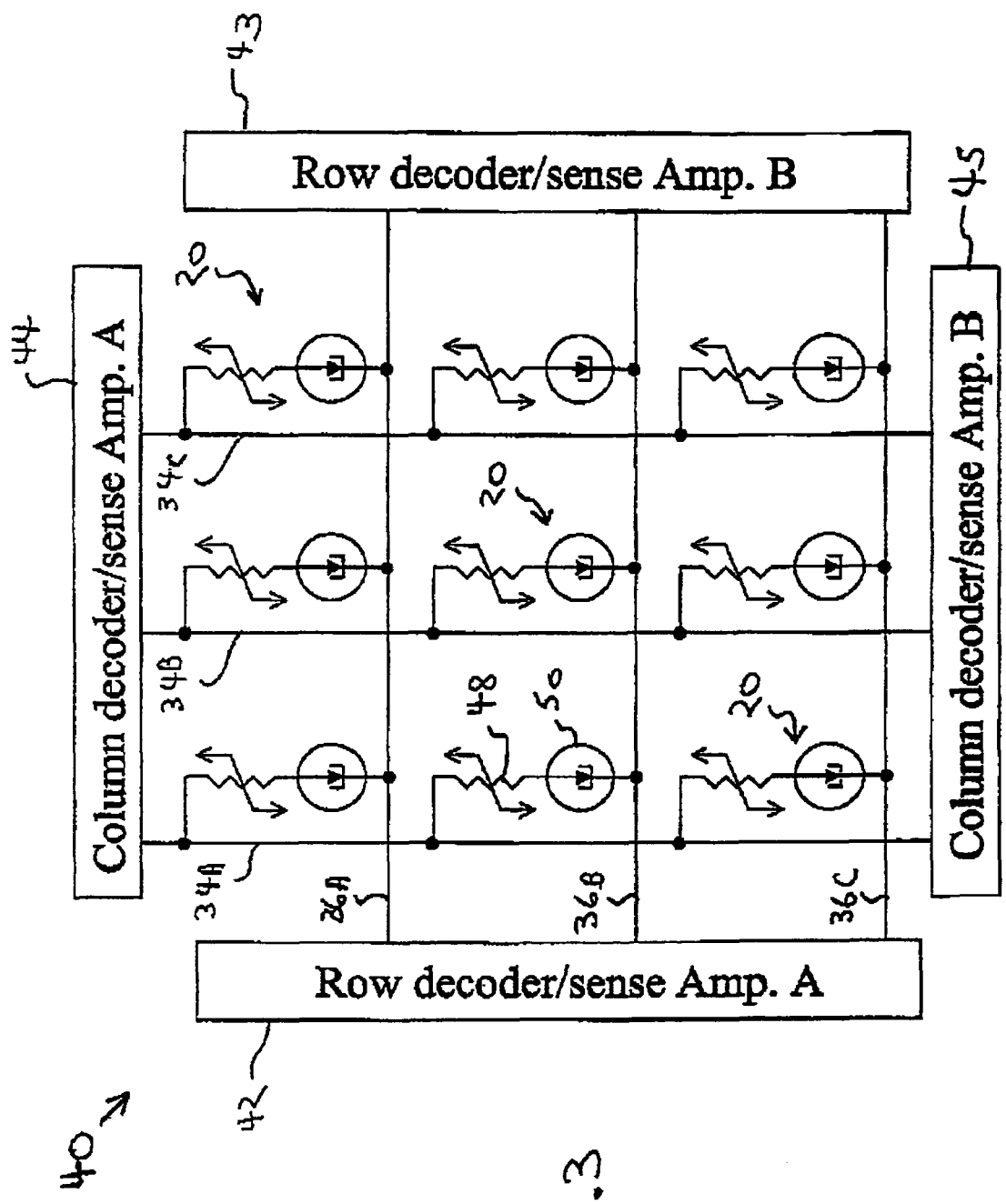
FIG. 3 is a schematic diagram of a magnetic random access memory circuit showing an array of memory cells located between column and row conductor lines.

Referring to FIG. 3, several of the magnetic memory units or cells 20 are shown formed into an array of memory cells 40. The array of memory cells 40 are interconnected by column conductor lines 34A, 34B and 34C and row conductor lines 36A, 36B and 36C. The row conductor lines and column conductor lines are oriented perpendicularly to each other. While three row and column conductor lines are shown, more than three can be used in array 40. One of the memory cells 22 is located at the intersection of each row conductor line and column conductor line. Column decoders and sensing amplifiers 44 and 45 are connected to the ends of column conductor lines 34A, 34B and 34C. Similarly, row decoders and sensing amplifiers 42 and 43 are connected to the ends of row conductor lines 36A, 36B and 36C. In order to read states of memory cells 22, individual ones of the column lines 34A, 34B and 34C and row lines 36A, 36B and 36C are activated. In FIG. 3, each memory unit 20 is shown as its electrical equivalent circuit of a two state variable resistor 48 and a diode 50. The resistor 48 and diode 50 are shown connected in series.

Figure 4:
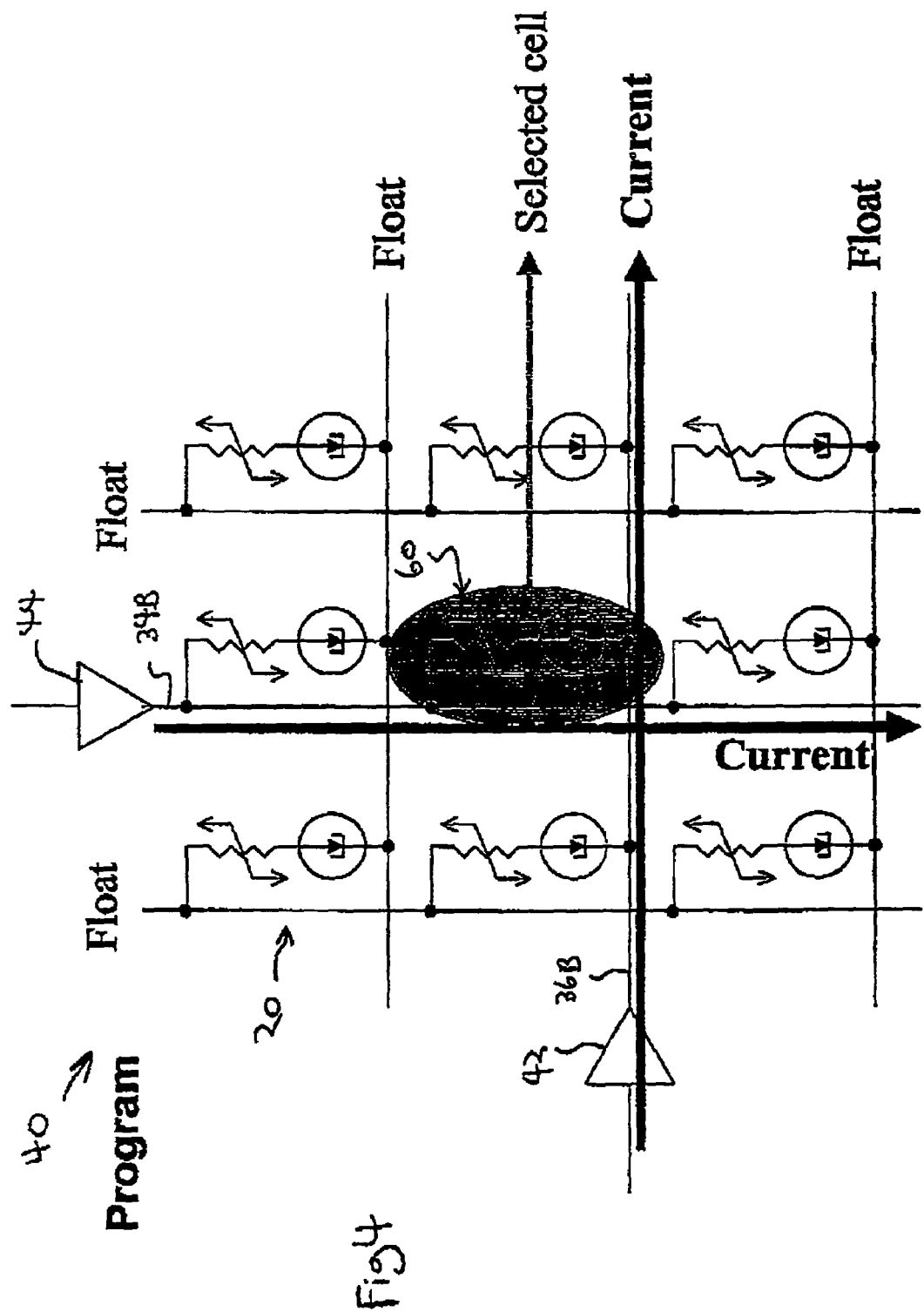
FIG. 4 is a schematic diagram of a magnetic random access memory circuit illustrating a write operation.

As shown in FIG. 4, a selected cell 60 is written to by passing a current from column decoder 44 through column conductor line 34B and by passing a current from row decoder 42 through row conductor line 36B at the same time. During the write operation, the column decoder 44 and row decoder 42 control the amount of current in each respective conductor line. When a sufficiently large current is passed through a pair of row and column conductor lines, the magnetic field of the combined current at the intersection of the conductor lines will cause rotation of the magnetization direction of the free magnetic layer 28 in a single memory cell 22. The current levels are selected so that the combined magnetic field exceeds the switching level of the free magnetic layer 28. The switching level of the free magnetic layer is determined by the coercivity and the magnetic anisotropy of the free magnetic layer. The magnetic field produced by either one of the row or column conductor lines alone is less than the magnetic field required to change the magnetic state in a cell. For example, when cell 60 is selected to be written to, the other surrounding cells 20 in the array of cells 40 are not written to. The combination of the magnetic fields from selected column line 34B and selected row line 36B is sufficient to change the state only of selected memory cell 60. The writing currents alter the magnetic orientation of the free magnetic layer 28. The non-selected row and column conductor lines such as 34A and 36A are shown in a floating state. The current flow is in the direction of the arrows in FIG. 4. The array 40 shown in FIG. 4 has only one selected cell 60, but any cell along the column and row lines could be the selected cell.

Figure 5:
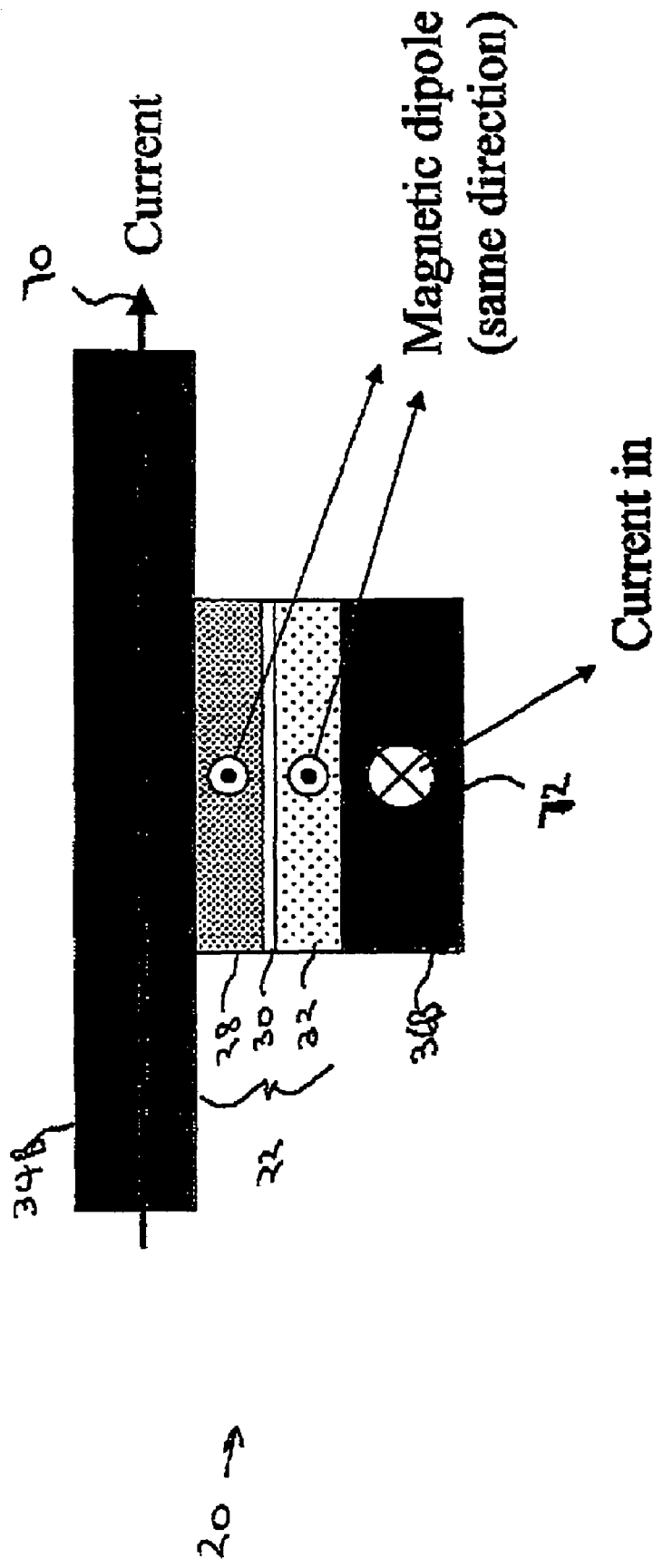
FIG. 5 is a schematic diagram showing a cross-sectional view of a memory cell during the writing of a low resistance to the memory cell.
Figure 6:
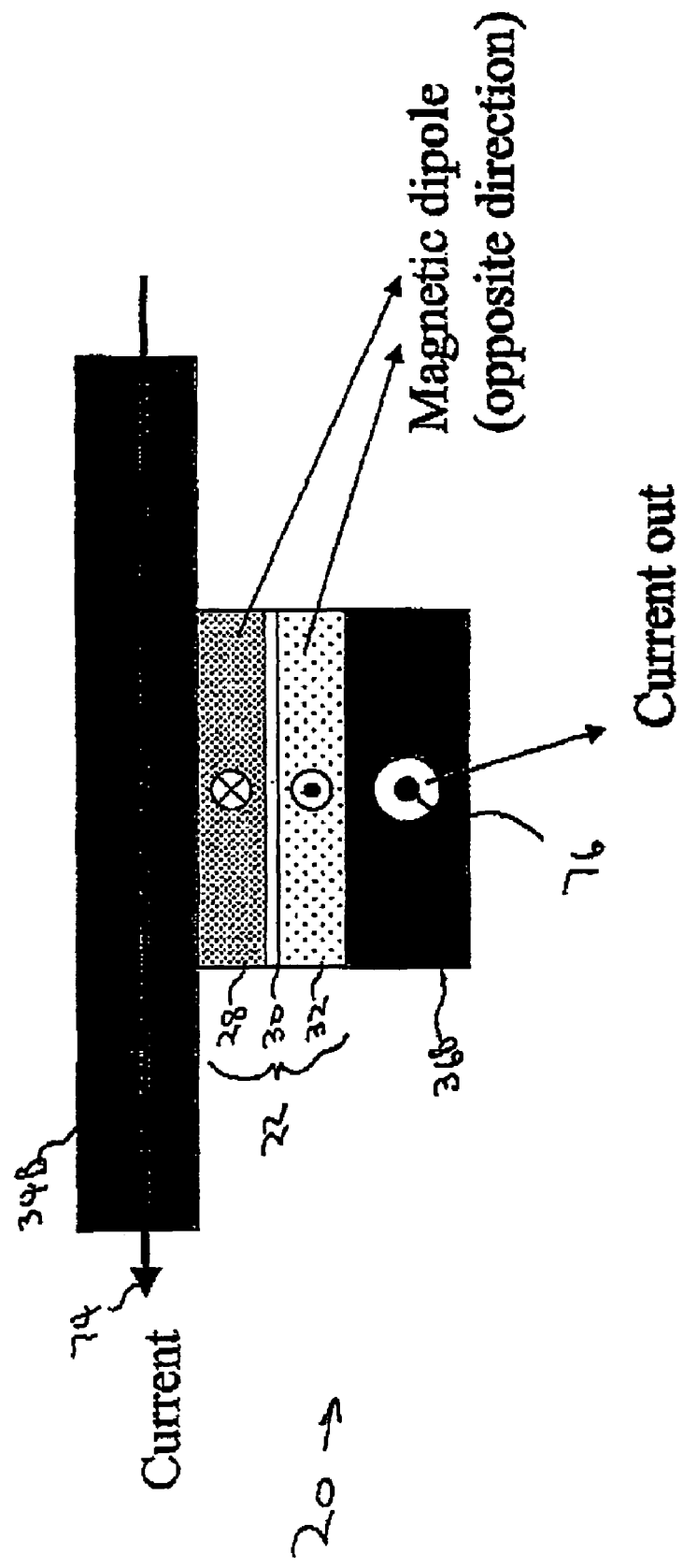
FIG. 6 is a schematic diagram showing a cross-sectional view of a memory cell during the writing of a high resistance to the memory cell.

Referring to FIGS. 5 and 6, cross-sectional views of memory cell during write operations showing current flows and magnetic orientations are provided. In FIG. 5, a one or low resistance state is being written to magnetic memory unit 20. A current 70 generated by column decoder 44 flows through column conductor line 34B in the direction shown. At the same time, a current 72 generated by row decoder 42 flows through row conductor line 36B in the direction shown. The currents flowing through the row and conductor lines are sufficient to change the magnetic orientation of the free magnetic layer 28. The orientation of the magnetic dipoles of the free magnetic layer 28 is the same as that of the pinned magnetic layer 32. These orientations are represented by the solid circles in the center of layers 28 and 32. When the magnetic orientations of the free and pinned magnetic layers are the same, the resistance measured through the memory cell 22 between the column and row conductor lines 34B and 36B has a low value.

In FIG. 6, a zero or high resistance state is being written to magnetic memory unit 20. A current 74 generated by column decoder 45 flows through column conductor line 34B in the direction shown. At the same time, a current 76 generated by row decoder 43 flows through row conductor line 36B in the direction shown. The currents flowing through the row and column conductor lines are sufficient to change the magnetic orientation of the free magnetic layer 28. The orientation of the magnetic dipoles of the free magnetic layer 28 is opposite that of the pinned magnetic layer 32. This is represented by the X in the center of layer 28 and a solid circle in the center of layer 32. When the magnetic orientations of the free and pinned magnetic layers is different, the resistance measured through the memory cell 22 between conductor lines 34B and 36B has a high value. It is noted that the currents in both the column conductor lines 34 and row conductor lines 36 are reversible in order to write the two different magnetic states to the magnetic memory units 20.

During a read operation of the magnetic memory unit 20, a sense current is passed through memory cell 22. The state of the memory cell is determined by measuring the resistance of the memory cell as determined by the sense current, and, as mentioned, the resistance of the memory cell depends on the relative magnetization direction of the free magnetic layer 28. The sense current is much smaller than the currents used during the write operation. Because the sense currents are small, the magnetic fields that they generate do not affect the magnetic state of the memory cell. In other words, the sense currents do not alter the magnetic orientation of the magnetic dipoles in the free magnetic layer 28.

Figure 7:
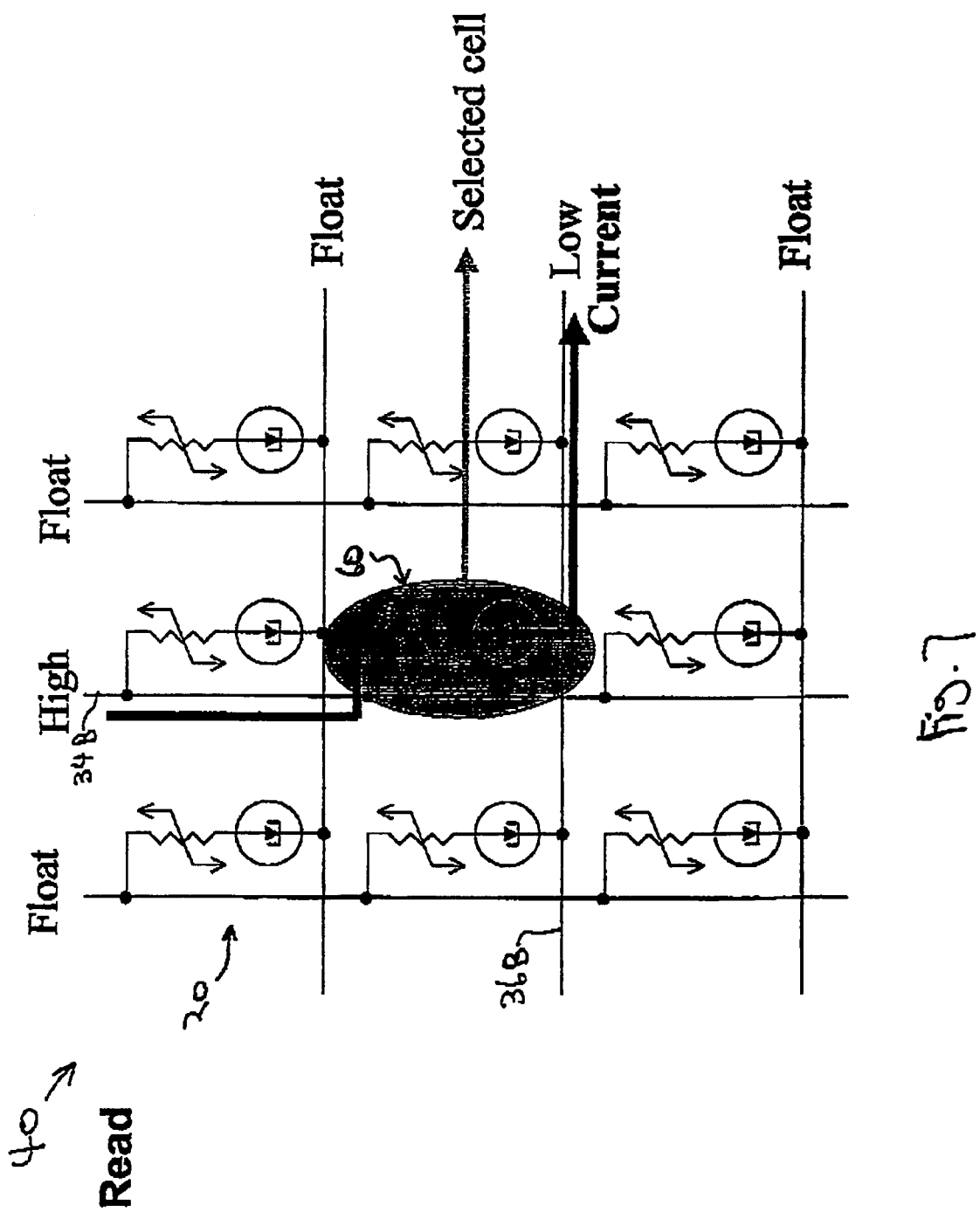
FIG. 7 is a schematic diagram of a magnetic random access memory circuit illustrating a read operation.

FIG. 7 shows magnetic memory array 40 during a read operation. A selected memory cell 60 is read by holding a relatively high voltage from column decoder 44 through column conductor line 34B and by holding a relatively low voltage from row decoder 43 through row conductor line 36B at the same time. This configuration results in a sense current flowing through the selected memory cell 60. The sense current flows through the free magnetic layer 28, insulating layer 30 and pinned magnetic layer 32. During the read operation, the column decoder 44 and row decoder 43 control the voltage level in each conductor line. The non-selected row and conductor lines such as 34A and 36A are allowed to be in a floating state. With continuing reference to FIG. 7 the current flow for the exemplary read operation is in the direction of the arrow shown in the figure, and the resistance of the selected memory cell 60 determines the sense current level. The sense current is read by the sensing amplifiers. A high sense current corresponds to a low resistance state of cell 22 which indicates the cell contents are read as a binary one. A low sense current corresponds to a high resistance state of cell 22 which indicates the cell contents are read as a binary zero.

Figure 10:
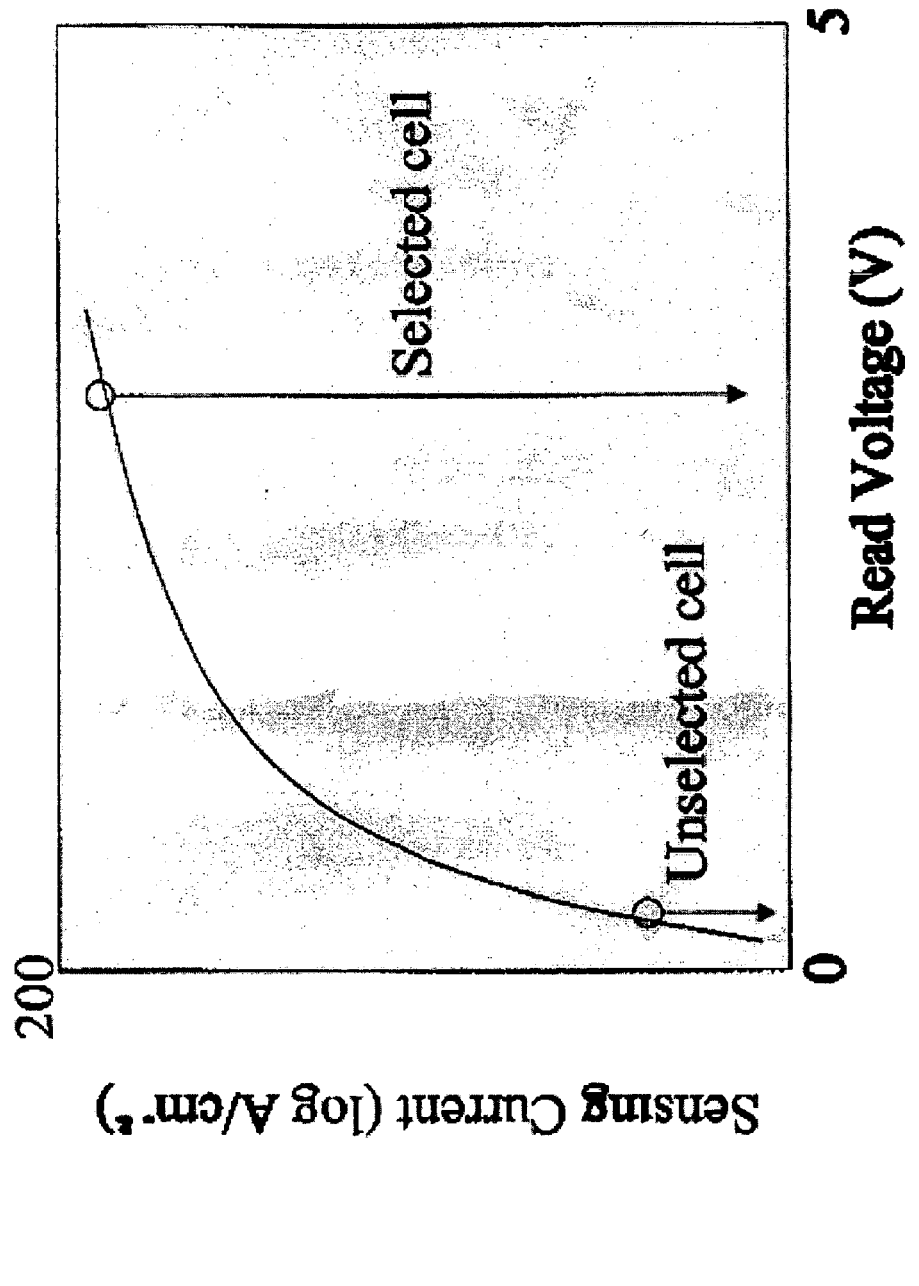
FIG. 10 is a graph of voltage versus current for a memory cell in a selected and unselected state.

FIG. 10 shows a graph of read voltage versus sensing current for memory cells that are selected and unselected to be read in magnetic memory array 40. The selected cell corresponds to the memory cell at the intersection of an engerized row and column conductor line. As shown in FIG. 10, an unselected cell has a low value of sensing current and read voltage. A selected cell has a high value of sensing current and voltage. The read voltage is shown varying from 0 to 5 volts. The sensing current is shown varying on a logarithmic scale of 0 to 200 amps per square centimeter.

Figure 8:
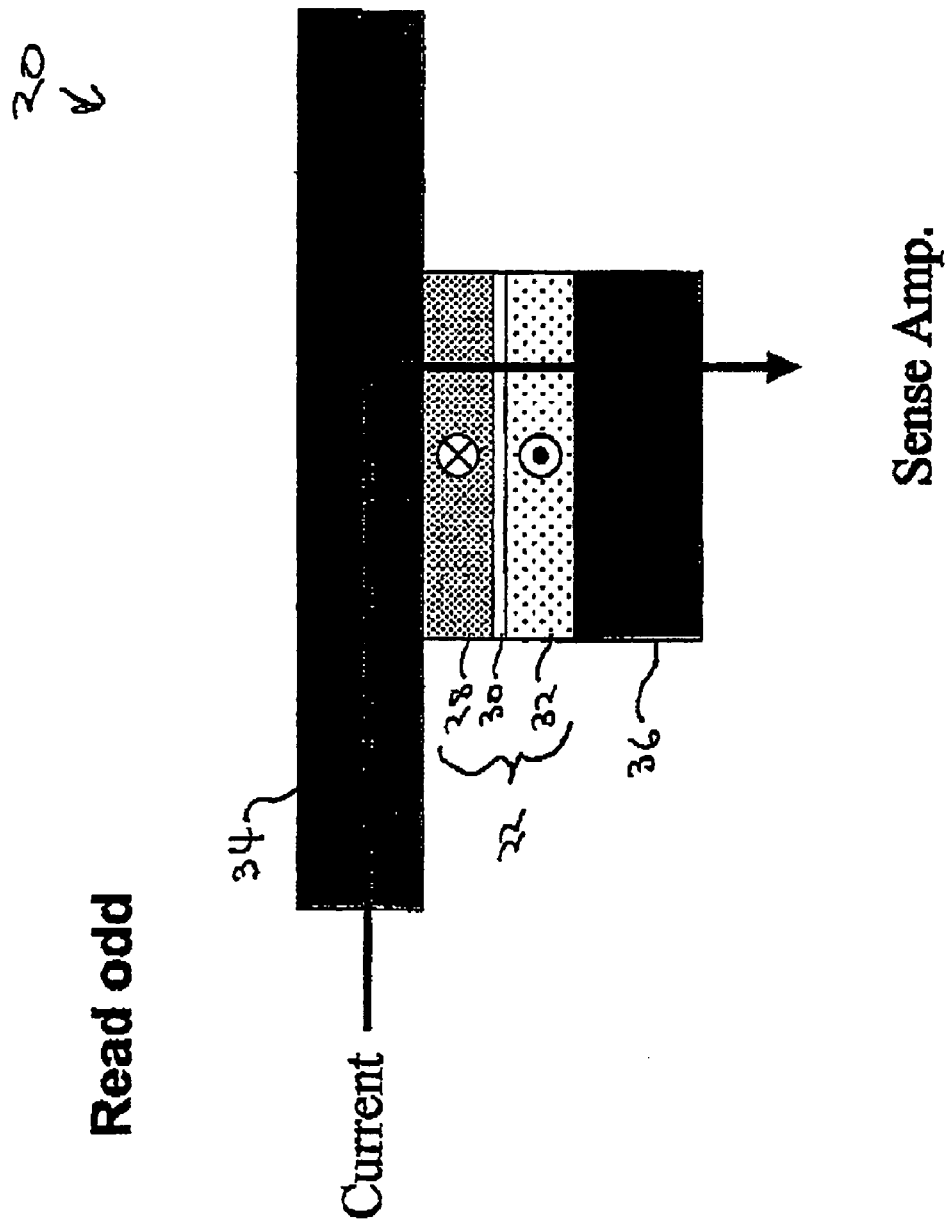
FIG. 8 is a schematic diagram showing a cross-sectional view of a memory cell during the read operation showing the current flow during odd numbered read cycles.
Figure 9:
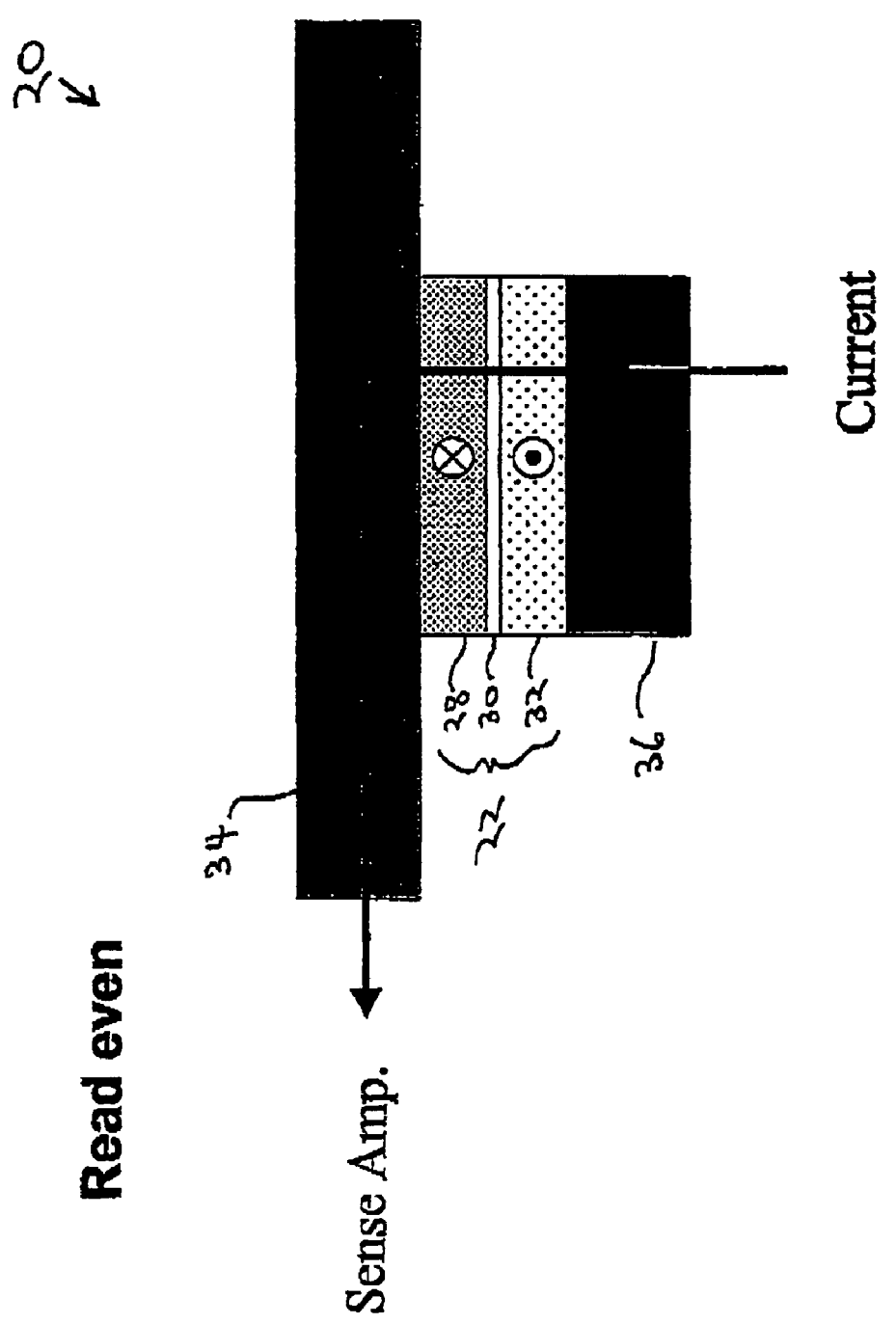
FIG. 9 is a schematic diagram showing a cross-sectional view of a memory cell during the read operation showing the current flow during even numbered read cycles.

Turning now to FIGS. 8 and 9, the current directions through a memory unit 20 are shown during odd and even numbered read operation cycles. In order to extend the non-volatile storage time of memory cells, the read current directions can be reversed after each read cycle for each cell. In modified embodiments, however, other intervals and protocols can be implemented for alternating the read current directions. For example, a change in current direction to a second direction can be implemented after two read cycles of a memory cell in a first direction. Still, in another embodiment, read current directions may stay the same or substantially the same for all read cycles or for all read cycles during a predetermined interval such as a predetermined operation or period of time. In FIG. 8, the current direction for an odd numbered read cycle is shown. The current flows from column conductor line 34 through memory cell 22 to row conductor line 36 where it is sensed by the sense amplifier. In FIG. 9, the current direction for an even numbered read cycle is shown. The current flows from row conductor line 36 through memory cell 22 to column conductor line 34 where it is sensed by the sense amplifier. The magnetic orientation of the free magnetic layer 28 is shown the same in FIGS. 8 and 9. The direction of current flow through the first memory cell is reversed for each subsequent read cycle. The current flow through the memory cell is therefore reversed every other read cycle. This alternating current through the memory cell can extend the storage life of the memory cell. It is believed that the alternating current can help to maintain the orientation of the magnetic dipoles in the free magnetic layer. The number of read cycles can be recorded for each memory cell in the array by the decoder circuitry.

In additional embodiments of the present invention, memory cell 22 can be formed to have modified configurations. The fixed magnetic layer 32 can have a multilayer structure comprised of two, three or more layers. For example, fixed magnetic layer 32 can be formed of two layers. The first layer can be a high-coercivity magnetic layer with low magnetization. The second layer can be a thin interface magnetic layer with good spin filtering. These multiple layers can be formed from cobalt, cobalt-iron alloys, cobalt-nickel alloys, or nickel-iron alloys. Having multiple layers for fixed magnetic layer 32 can result in a layer with different or better magnetic properties.

In another modified embodiment of the present invention, the insulating layer 30 can be formed of more than one layer. For example, the insulating layer 30 can be made up of two, three or more layers. Insulating layer 30 can have a first layer of magnesium oxide and a second layer of aluminum oxide. The magnesium oxide layer can be disposed adjacent the free magnetic layer 28 and the aluminum oxide layer can be disposed adjacent the fixed magnetic layer 32. Insulating layer 30 can be formed from a first layer of aluminum oxide adjacent the free magnetic layer 28 and a second layer of aluminum nitride adjacent the fixed magnetic layer 32.

In view of the foregoing, it will be understood by those skilled in the art that the designs and methods of the present invention can facilitate the formation of magnetic memory cells in non-volatile random access memory devices. The present invention can improve for example the storage life of magnetic memory cells. The aforementioned embodiments have been provided by way of example, and the present invention is not limited to these examples. Multiple variations and modification to the disclosed embodiments will occur, to the extent not mutually exclusive to those skilled in the art upon consideration of the foregoing description. Additionally, other combinations, omissions, substitutions and modifications will be apparent to the skilled artisan in view of the disclosure herein. Accordingly, the present invention is not limited by the disclosed embodiments, but is to be defined by reference to the appended claims.

What is claimed is:

1. A magnetic memory cell, comprising:
   a first ferromagnetic layer;
   a second ferromagnetic layer; and
   an insulating layer disposed between the first and second ferromagnetic layers, the insulating layer in combination with the first and second ferromagnetic layers forming a diode such that leakage currents are prevented.

2. The magnetic memory cell as set forth in claim 1, wherein:
   the second ferromagnetic layer is disposed on a bottom conductor line;
   the bottom conductor line is disposed on a substrate; and
   a top conductor line is disposed on the first ferromagnetic layer.

3. A memory cell array comprising a plurality of the magnetic memory cells of claim 2.

4. The memory cell array as set forth in claim 3, wherein the diodes prevent leakage currents between adjacent cells of the memory cell array.

5. The magnetic memory cell as set forth in claim 1, wherein the insulating layer is formed from the group consisting of:
   aluminum oxide;
   hafnium oxide; and
   zirconium oxide.

6. The magnetic memory cell as set forth in claim 1, wherein the first ferromagnetic layer is formed from iron-cobalt.

7. The magnetic memory cell as set forth in claim 1, wherein the second ferromagnetic layer is formed from nickel-iron.

8. A method of reading a memory structure, comprising:
   generating a first current during a first read cycle, the first current flowing from a column line through the memory structure to a row line; and
   generating a second current during a second read cycle, the second current flowing from the row line through the memory structure to the column line.

9. The method of reading a memory structure as set forth in claim 8, wherein the direction of current flow through the memory structure is reversed for each subsequent read cycle.

10. The method of reading a memory structure as set forth in claim 9, wherein the memory structure comprises:
    a free magnetic layer;
    a pinned magnetic layer; and
    an insulating layer disposed between the free and pinned magnetic layers.

11. The method of reading a memory structure as set forth in claim 9, wherein the reversal of the direction of current flow during read cycles extends a storage life of the memory structure.

12. The method of reading a memory structure as set forth in claim 8, wherein the memory structure comprises:
   a free magnetic layer;
   a pinned magnetic layer; and
   an insulating layer disposed between the free and pinned magnetic layers.

13. A memory cell, comprising:
   a fixed magnetic layer having a magnetic moment that is fixed in a pre-determined direction;
   a free magnetic layer having a magnetic moment that is free to rotate under an influence of an applied magnetic field; and
   an insulating layer disposed between the fixed and free magnetic layers;
   wherein the insulating layer in combination with the fixed and free magnetic layers form a tunneling diode, the tunneling diode allowing a current between the free magnetic layer when selected and the fixed magnetic layer when selected but blocking leakage currents between the fixed magnetic layer when not selected and the free magnetic layer when not selected.

14. A memory cell array comprising a plurality of the memory cells of claim 13, the memory cells being interconnected by a plurality of column conductor lines and row conductor lines with memory cell being disposed at junctions of the column conductor lines and the row conductor lines.

15. The memory cell as set forth in claim 14, wherein the column conductor lines are connected to the free magnetic layers and the row conductor lines are connected to the fixed magnetic layers.

16. The memory cell as set forth in claim 15, wherein the column conductor lines and the row conductor lines are connected to a decoder and sense amplifier at each of their respective ends.

17. The memory cell as set forth in claim 13, wherein the insulating layer is formed from the group consisting of aluminum oxide, hafnium oxide and zirconium oxide.

18. The memory cell as set forth in claim 13, wherein the tunnel diode prevents leakage currents from flowing between adjacent memory cells during a read cycle.

19. A method of reading an array of memory cells, comprising:
   providing a plurality of column lines and row lines connected across the array of memory cells;
   selecting a column line;
   selecting a row line during a first read cycle such that a first current flows from the column line through a first memory cell to the row line; and
   reversing the current flow during a second read cycle of the first memory cell such that the storage life of the memory cell is extended.

20. The method as set forth in claim 19, wherein a direction of the current flow through the first memory cell is reversed for each subsequent read cycle.

21. The method as set forth in claim 19, wherein the current flows from the row line to the column line during the second read cycle.

22. The method as set forth in claim 19, wherein the number of read cycles is recorded for each memory cell in the array.

* * * * *